United States Patent [19]

Carlson et al.

[11] 4,142,195
[45] Feb. 27, 1979

[54] SCHOTTKY BARRIER SEMICONDUCTOR DEVICE AND METHOD OF MAKING SAME

[75] Inventors: David E. Carlson, Yardley, Pa.; Christopher R. Wronski, Princeton; Alfred R. Triano, Jr., Scotch Plains, both of N.J.

[73] Assignee: RCA Corporation, New York, N.Y.

[21] Appl. No.: 710,186

[22] Filed: Jul. 30, 1976

Related U.S. Application Data

[63] Continuation-in-part of Ser. No. 668,908, Mar. 22, 1976, abandoned.

[51] Int. Cl.$^2$ .................. H01L 29/48; H01L 31/00
[52] U.S. Cl. .................. 357/15; 136/89 SJ; 136/89 TF; 357/2; 357/30; 427/84
[58] Field of Search .................. 357/30, 15, 2, 58, 16, 357/59; 427/39, 84, 86; 136/89 SJ

[56] References Cited

U.S. PATENT DOCUMENTS

| | | | |
|---|---|---|---|
| 3,424,661 | 1/1969 | Androshuk et al. | 427/39 |
| 3,473,959 | 10/1969 | Ehinger et al. | 427/39 |
| 3,958,262 | 5/1976 | Mescin | 357/2 |
| 3,961,997 | 6/1976 | Chu | 357/59 X |
| 3,978,333 | 8/1976 | Crisman et al. | 357/30 X |
| 4,064,521 | 12/1977 | Carlson | 357/2 |

OTHER PUBLICATIONS

W. E. Spear, "Localized States in Amorphous Semiconductors" Proceedings of the Fifth International Conference on Amorphous and Liquid Semiconductors, Sep. 3-8, 1973, pp. 2-11.
W. Fuhs et al., "Heterojunctions of Amorphous Silicon and Silicon Single Crystals" AIP Conference Proceedings No. 20, Mar. 20-22, 1974, pp. 345-350.
H. Mell, Proceedings of the Fifth Int. Conf. on Amorphous and Liquid Semiconductor, Fed. Rep. of Germany, Sep. 3-8, 1973, vol. I, pp. 217-218.
M. V. Schneider, "Schottky Barrier Photodiodes with Antireflection Coating," The Bell System Technical Journal, Nov. 1966, pp. 1611-1627.
R. C. Chittick, "Properties of Glow-Discharge Deposited Amorphous Germanium and Silicon," J. of Non-Crystalline Solids, vol. 3, pp. 255-270, 1970.
R. C. Chittick et al., "The Preparation and Properties of Amorphous Silicon," J. of the Electochemical Society, vol. 116, pp. 77-81, 1969.

*Primary Examiner*—Stanley D. Miller, Jr.
*Assistant Examiner*—James W. Davie
*Attorney, Agent, or Firm*—H. Christoffersen; Birgit E. Morris; A. Stephen Zavell

[57] ABSTRACT

A first layer of semiconductor device is of doped amorphous silicon prepared by a glow discharge in a mixture of silane and a doping gas. The first layer is on a substrate having good electrical properties. On the first layer and spaced from the substrate is a second layer of amorphous silicon prepared by a glow discharge in silane. On the second layer opposite the first layer is a metallic film forming a surface barrier junction therebetween, i.e. a Schottky barrier. The first layer is doped so as to make an ohmic contact with the substrate. Preferably the doping concentration of the first layer is graded so the dopant concentration is maximum at the interface of the first layer and the substrate. In a second embodiment of the Schottky barrier semiconductor device an intermediate layer is between and contiguous to both the first layer and the substrate. The intermediate layer facilitates in making ohmic contact between the amorphous silicon and the substrate. Annealing and heat treating steps are performed in the fabrication of the Schottky barrier device to increase device efficiency.

37 Claims, 5 Drawing Figures

SCHOTTKY BARRIER SEMICONDUCTOR DEVICE AND METHOD OF MAKING SAME

BACKGROUND OF THE INVENTION

This is a continuation-in-part of application Ser. No. 668,908, filed Mar. 22, 1976, now abandoned.

CROSS-REFERENCE TO RELATED APPLICATIONS

U.S. Ser. No. 710,183, "A Semiconductor Device Having A Body of Amorphous Silicon and Method of Making the Same", D. E. Carlson, filed July 30, 1976, U.S. Pat. No. 4,064,521.

U.S. Ser. No. 659,268, "A Semiconductor Device Having An Amorphous Silicon Active Region", D. E. Carlson, filed Feb. 19, 1976, now abandoned.

U.S. Ser. No. 599,588, "A Photovoltaic Device Having An Amorphous Silicon Active Region", D. E. Carlson, filed July 28, 1975, now abandoned.

The present invention relates to semiconductor devices and more particularly to photovoltaic devices and current rectifying devices utilizing amorphous silicon prepared by a glow discharge in silane.

Photovoltaic devices such as solar cells and photodetectors are capable of converting light, i.e., infrared through the ultraviolet range, into usable electrical energy. A problem encountered in the field of solar cells is that the cost of producing electrical energy from solar cells is often not competitive with other means of electrical energy generation. One of the largest expenses involved in solar cell manufacture is the cost of the semiconductor material utilized in the solar cell. Naturally, the more semiconductor material needed the higher the cost of a solar cell. The lowering of the amount of semiconductor material needed for photodetector devices would also lower their cost. If this same semiconductor material demonstrates current rectification properties in the dark, it could also be utilized in semiconductor devices such as diodes.

It has recently been discovered that the body of photovoltaic and current rectifier devices can be made very thin if they are of amorphous silicon prepared by a glow discharge in silane. However, a problem encountered in some of these devices is the making of an ohmic contact to amorphous silicon prepared by a glow discharge in silane. Thus, it would be most desirable in the semiconductor field to have a device that utilizes amorphous silicon with its accompanying benefits and also allows ohmic contact to be made to the amorphous silicon.

SUMMARY OF THE INVENTION

A Schottky barrier semiconductor device includes an annealed body of amorphous silicon fabricated by a glow discharge in silane. A metallic film is on a surface of the body providing a surface barrier junction at the interface of the metallic film and the body.

DETAILED DESCRIPTION OF THE INVENTION

Figure 1:
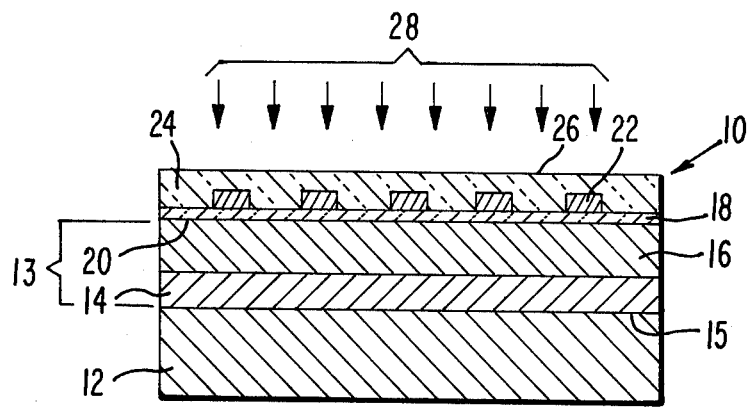
FIG. 1 is a cross-sectional view of the first embodiment of the Schottky barrier semiconductor device of the present invention.

Referring to FIG. 1, a first embodiment of the Schottky barrier semiconductor device of the present invention is designated as 10. The Schottky barrier semiconductor device 10 is subsequently described as a solar cell for the purposes of explaining the present invention. The semiconductor device 10 includes a substrate 12 of a material preferably having good electrical conductivity properties. Materials having this capability are typically aluminum, chromium, stainless steel, niobium, tantalum, iron and indium tin oxide on glass, where the indium tin oxide is the conductive material.

On a surface of the substrate 12 is a body 13 of amorphous silicon fabricated by a glow discharge in silane, $SiH_4$. The method of deposition well known to those in the art as glow discharge involves the discharge of electricity through gas at relatively low pressure, i.e., about 5 Torr or less, in a partially evacuated chamber. A glow discharge is characterized by several regions of diffuse, luminous glow, i.e., the positive column which is near the anode and the negative glow which is between the anode and cathode, and a voltage drop in the vicinity of the cathode that is much higher in potential than the ionization potential of the gas, i.e., the Crookes dark space region.

An amorphous material is one which has no long range order in the periodicity of the matrix. Amorphous silicon fabricated by a glow discharge in silane, $SiH_4$, possesses a short range order of no more than 20Å. The lack of long range order of an amorphous silicon material fabricated by a glow discharge in silane can be detected by X-ray or electron diffraction.

The body 13 includes a first layer 14 of amorphous silicon fabricated by a glow discharge in a mixture of silane and a doping gas. The first layer 14 is capable of having an ohmic contact with the substrate 12, and having a first interface 15 therebetween. A second layer 16 of amorphous silicon of the body 13 is on the first layer 14 opposite the substrate 12. The second layer 16 is fabricated by a glow discharge in silane, $SiH_4$, and typically by a glow discharge in substantially pure silane. Since the glow discharge may be in substantially pure silane, it would be anticipated that the second layer 16 is undoped, but it has been discovered that the second layer 16 even if fabricated in pure silane is slightly N-type, i.e., for deposition on a deposition surface heated to a temperature greater than 100° C. The first and second layers 14 and 16 are of the same conductivity type. Preferably the dopant concentration of first layer 14 is graded such that the concentration of the dopant is a maximum at the interface 15 and decreases to an insignificant concentration at the interface of first layer 14 and second layer 16. Although it is preferred that the first layer have a graded doping concentration, for reasons subsequently explained, it is also anticipated by the present invention that the dopant concentration be uniform throughout the first layer 14.

The amorphous silicon of the first and second layers 14 and 16 is formed by a glow discharge in silane plus an appropriate doping gas for layer 14, and can be distinguished from other amorphous silicon in that it has the kinetic characteristics of an average density of localized states in the energy gap on the order of $10^{17}/cm^3$ or less. The average density of localized states is determined by plotting the ratio of one over the capacitance squared ($1/C^2$) as a function of voltage for the amorphous silicon semiconductor device. From the shape of this plot the average density of localized states can be determined by those skilled in the art. For amorphous silicon fabrication by a glow discharge in silane the drift mobility for electrons is $10^{-3} cm^2/V$-sec. or greater. The drift mobility for electrons is measured by the well known technique of impinging light pulses or electron beam pulses on the biases semiconductor device and the subsequent flow of electrons generated by the pulses is followed by a sampling system. Furthermore, it has been estimated from photoconductivity measurements that the electron carrier lifetime of amorphous silicon fabricated by a glow discharge in silane is on the order of $10^{-5}$ seconds. Although it is anticipated that amorphous silicon fabricated by a glow discharge in silane with an electron lifetime on the order of $10^{-7}$ seconds or greater will also possess good electrical characteristics.

The first layer 14 is typically in the range of 100Å to about 0.5 microns in thickness and the second layer 16 is about one half to one micron in thickness.

On a surface of the second layer 16 opposite the first layer 14 is a metallic film 18, with an interface 20 therebetween. The metallic film 18 is at least semitransparent to solar radiation and is of a metallic material with good electrical conductivity and of a high work function, i.e., greater than 4.5eV, assuming the second layer 16 is of an N- type conductivity. Metallic materials having good electrical conductivity and a high work function are, for example, gold, silver, platinum, palladium, rhodium, iridium or chromium. The metallic film 18 may be a single layer of a metal or it may be multi-layered. If the metallic film 18 is multi-layered a first layer could be of platinum on the second layer 16 and a second layer on the first platinum layer could be gold or silver for good electrical conductivity. As stated previously, the metallic film 18 is a semi-transparent to solar radiation, and since it is a metal it should be on the order of about 100Å to assure semi-transparency.

Typically, the first layer 14 is of N type conductivity, although it is anticipated that the Schottky barrier device of the present invention can also have a first layer 14 of P type conductivity. If the first layer 14 is of P type conductivity, the second layer 16 would be doped so that it is slightly P type and the metallic film 18 would be of a low work function metal, less than about 4.3eV, e.g. aluminum.

On a portion of the surface of the metallic film 18 opposite the interface 20 is an electrode 22. Typically, the electrode 22 is in the shape of a grid, although it can be of other shapes well known to those in the art, e.g. finger or comb shaped, and it is of a metal having good electrical conductivity.

The electrode 22 for purposes of disclosing the present invention has two sets of grid lines, with the grid lines of each set substantially parallel to each other and intersecting the grid lines of the other set. The electrode 22 occupies only a small area on the surface of the metallic film 18, i.e., about 5 to 10% of the film 18 surface area, since solar radiation impinging the electrode 22 may be reflected away from the device 10. The function of the electrode 22 is for the uniform collection of current from the metallic film 18. The electrode 22 facilitates in keeping the series resistance of the device 10 low when in operation as part of a circuit. However, it is anticipated that only a single set of grids may be necessary for uniform current collection in small surface area devices thereby being in the form of what is known in the art as a fingered or comb shaped electrode.

An antireflection layer 24 is on the electrode 22 and on the surface of the metallic film 18 opposite the interface 20 not occupied by the electrode 22. The antireflection layer 24 has an incident surface 26 on which solar radiation 28 is capable of impinging. As is well known in the art, there is an increase in the solar radiation 28 traversing the metallic film 18 and entering the device 10 by having the antireflection layer 24 of a thickness on the order of $\lambda/n$, wherein $\lambda$ is the wavelength of the radiation impinging the incident surface 26, and n is the index of refraction of the antireflection layer 24. The index of refraction, n, of the antireflection layer 24 should be of an apropriate value to increase the amount of solar radiation 28 impinging the metallic film 18. For example, if the metallic film 18 is platinum, 100Å in thickness, a suitable antireflection layer 24 would be of zirconium oxide, $ZrO_2$, about 500Å in thickness with n = 2.1. In essence, the antireflection layer 24 reduces the amount of light that would be reflected from the device 10. Usually, the antireflection layer 24 will be of a dielectric material such as zinc sulfide, zirconium oxide, or silicon nitride, but can be a transparent semiconductor such as tin oxide doped with antimony, or indium oxide doped with tin.

In the field of semiconductor devices it is well known that a surface barrier junction, generally known as a Schottky barrier, is formed as a result of the contacting of certain metals to certain semiconductor materials. In the Schottky barrier semiconductor device 10 of the present invention, the barrier junction is formed at the interface 20 by contacting the metallic film 18 to the second layer 16. A Schottky barrier generates a space charge or electric field in the semiconductor material of device 10 from the interface 20 which penetrates into the second layer 16 and is referred to as the depletion region. Also, as a result of the graded doping concentration of the first layer 14 an electric field is created in the first layer 14. Therefore, with the Schottky barrier at interface 20 and the graded dopant concentration of the first layer 14 an electric field extends essentially through both the first and second layers 14 and 16. It is preferable for at least photovoltaic devices of the present invention that the electric field extend through the first and second layers 14 and 16. With the electric field extending through the first and second layers 14 and 16, carriers created anywhere within these layers, as a result of the absorption of solar radiation 28, are swept by the electric field to either the substrate 12 or the metallic region 18. The substrate 12 functions as one of the electrodes of device 10. If the electric field does not extend into a portion of the first or second layers 14 and 16 of device 10, any carriers generated in this quasi-neutral portion would not be swept to an electrode by means of a field and must rely on diffusion to the depleted region in order to be collected. Also, any quasi-neutral region may contribute to the series resistance when drawing current from the device, and this series resistance would lower device efficiency.

While the graded doping concentration of first layer 14 is advantageous in lengthening the electric field region of the device 10, in addition an ohmic contact can more readily be formed between the first layer 14 and substrate 12 because the doping concentration is maximum at the first interface 15, i.e., on an order of 5 atomic percent. The forming of an ohmic contact at interface 15 is advantageous in assuring a low series resistance for the semiconductor device 10. Even if the first layer 14 has a uniform dopant cconcentration throughout, an ohmic contact can be formed at interface 15 as long as the uniform dopant concentration is on the order of 5 atomic percent.

The amorphous silicon of the first layer 14 fabricated by a glow discharge in silane plus a doping gas, and the amorphous silicon of the second layer 16 fabricated by a glow discharge in silane possesses characteristics ideally suited for photovoltaic devices. Electron lifetime in amorphous silicon fabricated by a glow discharge in silane is estimated to be on the order of about $10^{-5}$ seconds, while electron lifetime in amorphous silicon formed by sputtering or evaporation is in the order of $10^{-11}$ seconds.

Also measurements of the spectral response of the device of the present invention indicates a high collection efficiency through the visible portion of the spectrum, e.g. the average collection efficiency in the spectral range of 4,000Å to 7,000Å is on the order of 50%.

Figure 2:
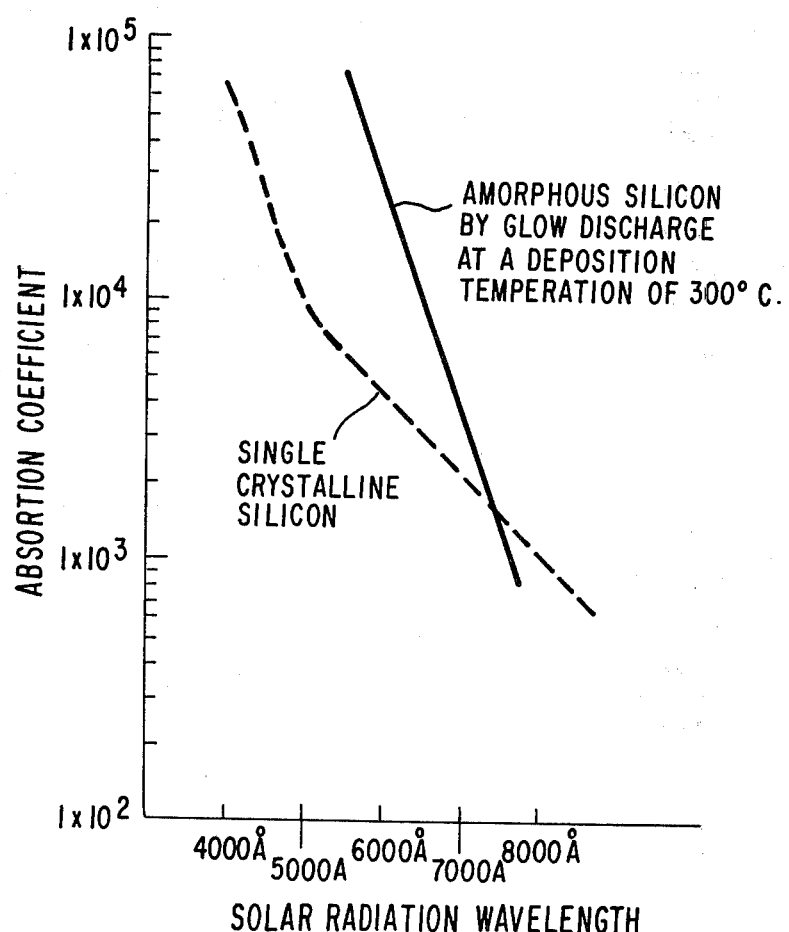
FIG. 2 is a graph comparing the absorption coefficient of single crystal silicon to glow discharge amorphous silicon in the visible light range.

The optical absorption of the glow discharge amorphous silicon is superior to that of single crystalline silicon over the visible light range, i.e., 4,000Å to 7,000Å. Referring to FIG. 2, it is shown that the amorphous silicon has a larger absorption coefficient over the visible range than single crystalline silicon. This means that a body of glow discharge amorphous silicon can be a factor of 10 thinner than single crystal silicon and provide comparable light absorption in the visible range.

Furthermore, the average density of localized states in the energy gap of glow discharge amorphous silicon is on the order of $10^{17}/cm^3$ or less. The average density of localized states of glow discharge amorphous silicon decreases with increasing deposition temperature and increasing purity of the silane in the fabrication of the amorphous silicon. This average density of localized states of the glow discharge amorphous silicon is much lower than that of amorphous silicon fabricated by other means, i.e., for sputtered or evaporated amorphous silicon the average density of localized states is $10^{19}/cm^3$ or greater. Significant about the average density of localized states in the energy gap is that it is inversely proportional to the square of the width of the depletion region. Since glow discharge amorphous silicon's density of states is relatively low, a depletion width on the order of one mircon can be obtained. Also, singificant about the average density of localized states near mid-gap is the fact that carrier lifetime is inversely proportional to the average density of states. This point reaffirms that the carrier lifetime of glow discharge amorphous silicon is larger than that of amorphous silicon fabricated by the other processes mentioned.

Figure 3:
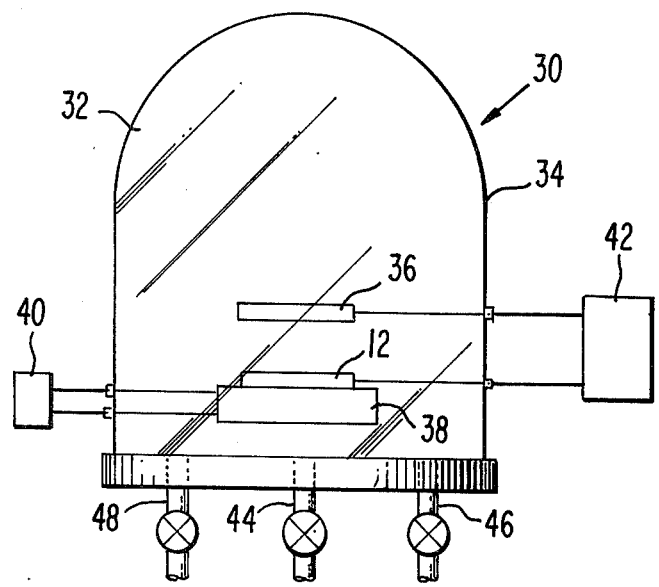
FIG. 3 is a schematic view of a first apparatus for carrying out the fabrication of amorphous silicon by a glow discharge in silane.

Referring to FIG. 3, a glow discharge apparatus suitable for carrying out the fabrication of the semiconductor device 10 of the present invention is generally designated as 30. The glow discharge apparatus 30 includes a chamber 32 defined by a vacuum bell 34, typically of a glass material. In the vacuum chamber 32 is an electrode 36, and a heating plate 38 spaced from and opposite the electrode 36. The electrode 36 is of a metallic material having good electrical conductivity such as platinum and is in the form of a screen or coil. The heating plate 38 is a ceramic frame with enclosed heating coils which are energized from a current source 40, external to the vacuum chamber 32.

A first outlet 44 into the vacuum chamber 32 is connected to a diffusion pump, a second outlet 46 is connected to a mechanical pump, and a third outlet 48 is connected to a gas bleed in system which is the source of the various gases utilized in the glow discharge process. While the second outlet 46 is described as being connected to a diffusion pump, it is anticipated that a diffusion pump may not be necessary sine the mechanical pump connected to the first outlet 44 may evacuate the system to a sufficient pressure.

In the fabrication of the semiconductor device 10, the substrate 12, e.g. #304 stainless steel, is placed on the heating plate 38 and is connected to one terminal of a power source 42 and the electrode 36 connected to an opposite terminal of power source 42. A voltage potential therefore exists between the electrode 36 and substrate 12. The power source 42 can be either D. C. or it can be A.C., i.e., in the low frequency range for example 60 Hertz, or it can be R. F., i.e., in the high frequency range, for example on the order of megahertz. Typically, when the power source 42 is D. C. the electrode 36 is connected to the positive terminal of the power source 42, and the substrate 12 is connected to the negative terminal of the power source 42. Thus, the electrode 36 functions as an anode and the substrate 12 functions as a cathode when the power source 42 is energized. This is referred to as a cathodic D. C. operation. However, in D. C. operation the substrate 12 and electrode 36 can be of the opposite polarities described, i.e., the substrate 12 is the anode and the electrode 36 is the cathode, which is referred to an anodic D. C. operation. It has been discovered that the deposition rates are somewhat higher in the cathodic mode than in the anodic mode. Furthermore, R. F. glow discharge operation can be accomplished in electrodeless glow discharge apparatus of a type well known to those in the art, e.g. capacitive R. F. glow discharge system and inductive R. F. glow discharge system. However, more uniform deposition over a large area, i.e., greater than $10cm^2$ is attained in D. C. or A. C. glow discharge than in electrodeless, R. F. glow discharge. Next, the vacuum chamber 32 is typically evacuated to a pressure of about $10^{-3}$ to $10^{-6}$ Torr, and the substrate 12 is heated to a temperature in the range of 150° to 450° C. by energizing the heating coils of the heating plate 38.

Then, an atmosphere of about 98.5% silane, $SiH_4$, and about 1.5% N type dopant gas, is bled into the vacuum chamber 32 to a pressure of 0.1 to 5.0 torrs and as a result the substrate temperature is raised to a value in the range of 200° C. to 500° C. Typical N type dopant gases which may be utilized in glow discharge processes are phosphine, $PH_3$, and arsine, $AsH_3$. Also, materials such as antimony, Sb, bismuth, Bi, sodium hydride, NaH, and cesium nitride, $CsN_3$, can be used by placing them in an evaporation boat and heating them in the atmosphere of the vacuum chamber 32 until the desired amount of the dopant gas or vapor is released into the silane atmosphere.

To initiate the glow discharge between the electrode 36 and the substrate 12, the power source 42 is energized, thereby commencing the deposition of the doped amorphous silicon layer 14. The D. C. cathodic mode of operation is assumed. For deposition of the first layer 14 the current density should be in the range of 0.1 to 3.0 ma/cm$^2$ at the surface of the substrate 12. The deposition rate of the amorphous silicon increases with the vapor pressure of the silane and the current density. For a pressure of 2 torrs and current density of 1 ma/cm$^2$ to a cathodic substrate 12 at 350° C., the deposition of approximately 200Å of doped amorphous silicon occurs in a few seconds. To grade the dopant concentration of the first layer 14, additional silane is beld into the vacuum chamber 32 during the glow discharge deposition.

Once the glow discharge is initiated for the D. C. cathodic mode, electrons from the substrate 12 are emitted from the substrate and strike silane molecules, SiH$_4$, both ionizing and disassociating the molecules. The positive silicon ions and positive silicon hydride ions such as SiH$^+$, are attracted to the substrate 12, which is the cathode and silicon containing some hydrogen is thereby deposited on the substrate 12. It is believed that the presence of hydrogen in the amorphous silicon is beneficial to its electronic properties.

The atmosphere in the vacuum chamber 32 is then pumped out by the mechanical pump 46.

With the vacuum chamber 32 at a pressure of about 10$^{-6}$ torrs, substantially pure silane is beld into the vacuum chamber 32 at a pressure in the range of 0.1 to 5 torrs. Again a glow discharge is initiated for 1 to 5 minutes with a current density of from 0.3 ma/cm$^2$ to 3.0 ma/cm$^2$ at the first layer 14 for the deposition of the second layer 16 of amorphous silicon. It has been found that the second layer 16 of amorphous silicon fabricated by a glow discharge in substantially pure silane is of a slightly N-type conductivity, when deposited on a first layer 14 which is at a temperature above 100° C.

The temperature of the substrate 12 in the glow discharge process may influence the composition and structure of the material deposited thereon due to the effects of auto doping, eutectic formation and induced crystallization, e.g. deposition on a single crystalline silicon substrate at temperatures above about 500° C. results in the deposition of a polycrystalline silicon, and deposition on a gold substrate at a temperature above 186° C. results in induced crystallization of the deposited silicon.

After deposition of the first and second layers 14 and 16 the body 13 can be annealed by subjecting the body 13 to a temperature in the range of 200° C. to 450° C. for a few minutes to several hours. It is anticipated that the annealing step will require several hours only for the lower annealing temperatures. Typically, annealing can be accomplished by leaving the body 13 in the glow discharge apparatus 30 after the glow discharge is terminated, or by placing the wafer in an annealing furnace of the type well known to those in the art. The annealing may take place in either an evacuated atmosphere or in a forming gas atmosphere, e.g., 90% nitrogen and 10% hydrogen by volume or atmospheres of pure nitrogen or pure hydrogen. This processing step anneals out lattice defects in the amorphous silicon body 13 and has been found to improve device efficiency.

Next, the body 13 is placed in a state of the art evaporation system and the metallic film 18 is evaporated onto the second layer 16. Likewise, the electrode 22 and antireflection layer 24 are deposited on the metallic film 18 by state of the art evaporation and masking techniques. The entire processing may be accomplished in a single system accommodating both glow discharge and evaporation.

It has also been discovered that when the semiconductor device 10 having a metallic film 18 of a material selected from the group consisting of chromium, iridium, rhodium, platinum, or palladium is subjected to a heat treatment during fabrication, the collection efficiency of the device increases. Typically, the heat treatment step can occur after the antireflection layer 24 is deposited, or it may occur both prior to deposition of the electrode 22 and after deposition of the antireflection layer 24. Specifically, the heat treatment involves placing the semiconductor device 10 in a heat treating chamber of a type well known to those in the art and subjecting the device 10 to a temperature in the range of 150° C. to 250° C. for about 5 to 30 minutes. The heat treating chamber may be evacuated or have a forming gas atmosphere, e.g. 90% nitrogen and 10% hydrogen by volume or atmospheres of pure nitrogen or pure hydrogen. This heat treating step has been found to increase device efficiency, by causing an increase in Schottky barrier height, improvement in collection efficiency and reduction in effective series resistance of the device. Fabrication of the semiconductor device 10 is completed by the connecting of wire electrodes (not shown) to the substrate 12 and electrode 22 for connection to external circuitry.

In operation of the semiconductor device 10 the substrate 12 may reflect unabsorbed solar radiation back into the first and second layer 14 and 16, thereby improving the possibility for solar radiation absorption.

Figure 4:
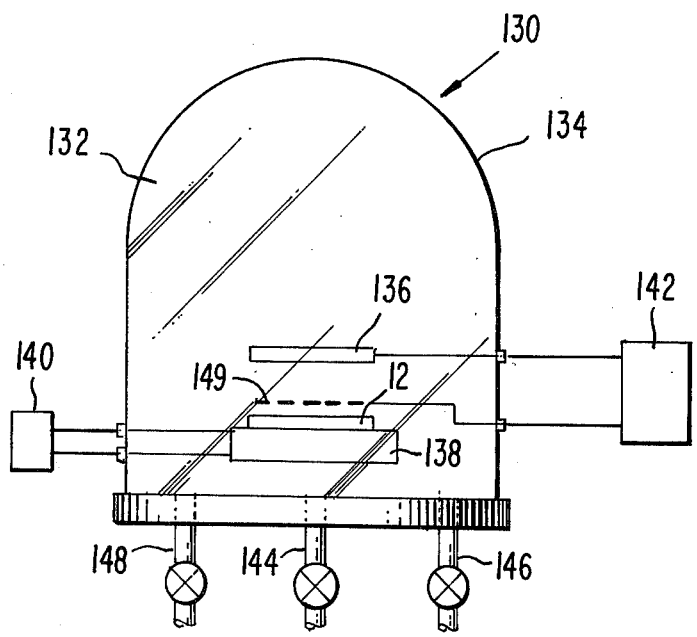
FIG. 4 is a schematic view of a second apparatus for carrying out the fabrication of the amorphous silicon by a glow discharge in silane.

Referring to FIG. 4, a second glow discharge apparatus for the fabrication of the semiconductor device 10 is designated as 130. The apparatus 130 is similar to the apparatus 30. Specifically, vacuum chamber 132, vacuum bell 134, electrode 136, heating plate 138, current source 140, power source 142, first outlet 144, second outlet 146 and third outlet 148 of apparatus 130 are the same as vacuum chamber 32, vacuum bell 34, electrode 36, heating plate 38, current source 40, power source 42, first outlet 44, second outlet 46 and third outlet 48 of apparatus 30 respectively. Apparatus 130 unlike apparatus 30 has an electrode 149, which is in the form of a screen. The screen electrode 149 is of an electrically conductive material such as a metal like stainless steel, and has openings therein which are smaller in size than the cathode dark space region of the glow discharge. The screen electrode 149 is between the electrode 136 and heating plate 138 and is spaced over the substrate 12 a distance which is on the order of the cathode dark space region of the glow discharge.

The operation of apparatus 130 differs from that of apparatus 30 in that the substrate 12 is not electrically connected to the power source 142, instead the screen electrode 149 is electrically connected to the power source 142. Thus, the screen electrode 149 is connected to one terminal of power source 142 and the electrode 136 is connected to the opposite terminal. If a D. C. cathodic mode of operation is assumed, when the power source 142 is energized and a glow discharge initiated, the positive ions in the glow discharge are drawn to the screen electrode 149. However, most of the positive ions will pass through the openings in the screen electrode 149.

The apparatus 130 having the screen electrode 149 can be used when the substrate 12 is an insulator to which no electrical contact can be made. However, the apparatus 130 can also be utilized in the fabrication of amorphous silicon devices in which the substrate 12 is not an insulator.

The apparatus 130, like the apparatus 30, can be operated in the D. C. cathodic or anodic modes.

Figure 5:
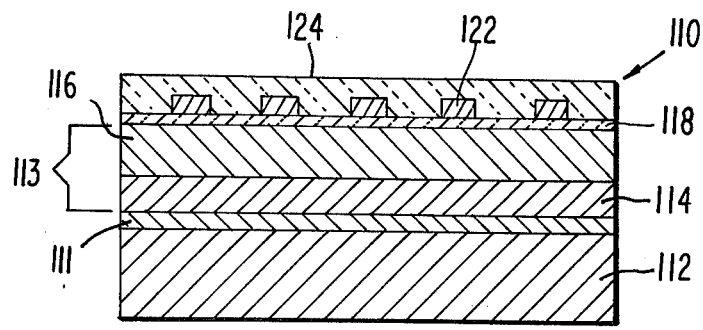
FIG. 5 is a cross-sectional view of the second embodiment of the Schottky barrier semiconductor device of the present invention.

Referring to FIG. 5, a second embodiment of the Schottky barrier semiconductor device of the present invention is designated as 110. The semiconductor device 110 includes an electrically conductive substrate 112. On a surface of the substrate 112 is an intermediate layer 111 with a body 113 on the intermediate layer 111. The body 113 includes a first layer 114 on the intermediate layer 111 opposite the substrate 112, and a second layer 116 on the first layer 114 opposite the substrate 112. A semitransparent metallic film 118 is on the second layer 116 opposite the substrate 112 forming a surface barrier junction therebetween. On a portion of the metallic film 118 is an electrode 122 with an antireflection layer 124 on the remaining portion of the metallic film 118 and on the electrode 122. The substrate 112, first layer 114, second layer 116, metallic film 118, electrode 122 and antireflection layer 124 of device 110 are the same as the substrate 12, first layer 14, second layer 16, metallic film 18, electrode 22 and antireflection layer 24, of the semiconductor device 10, respectively. The only difference between semiconductor device 10 and semiconductor device 110 is that device 110 has an intermediate layer 111 which device 10 does not.

The intermediate layer 111 is of a material that will make ohmic contact to both the substrate 112 and first layer 114. Typically, the intermediate layer 111 will be of doped amorphous germanium or of a doped amorphous germanium-silicon alloy. For either material the layer 111 is usually of N type conductivity if the second layer 16 is slightly N type. It has been found that amorphous germanium is a good material for forming an ohmic contact between doped amorphous silicon and metallic substrate 112. Particularly when the substrate 112 is of aluminum the electrical conductivity between the first and second layers 114 and 116 of device 110 and substrate 112 is better than the electrical conductivity between the first and second layers 14 and 16 of device 10 and substrate 12.

The operation of the Schottky barrier semiconductor device 110 is the same as that described for the semiconductor device 10. The fabrication of the semiconductor device 110 is similar to that of device 10 except that the intermediate layer 111 is deposited by a glow discharge onto the substrate 112 prior to the deposition of the first layer 114 by a glow discharge. Referring to FIG. 3, the fabrication of the intermediate layer 111 is accomplished by placing the substrate 112 on the heating plate 38, heating the substrate to a temperature in the range of 150° C. to 450° C. and evacuating the chamber 32 to a pressure of about 0.5 to 1.0 $\times$ 10$^{-6}$ torrs. Next, determined by the desired compositions of the intermediate layer 111 are bled into chamber 32 to a pressure in the range of 0.1 to 5.0 torrs. If the intermediate layer 111 is to be of doped germanium the atmosphere comprises about 99% germane, GeH$_4$, and about 1% of a doping gas such as the N type doping gas phosphine, PH$_3$. If the intermediate layer 111 is to be of doped germanium-silicon alloy the atmosphere may include about 60% germane, GeH$_4$, 39.5% silane, SiH$_4$, and about 0.5% of a doping gas such as the N type doping gas phosphine PH$_3$. The glow discharge is then initiated and continues for about 2 seconds for the deposition of the intermediate layer 111 about 200Å in thickness. The atmosphere in the vacuum chamber 32 is then pumped out by the mechanical pump 46. The remainder of the semiconductor device 110 fabrication is the same as that previously described for the semiconductor device 10.

Although the semiconductor devices 10 and 110 of the present invention have been described as solar cells, it is anticipated that semiconductor devices 10 and 110 can be utilized as a high frequency photodetector, i.e., a device which responds to radiant energy. It has been discovered that these photodetectors having a first layer of doped amorphous silicon contiguous to a second layer of amorphous silicon prepared by a glow discharge in silane have a high frequency response on the order of 10 MHz or more. In utilizing the semiconductor devices 10 and 110 as a photodetector it is well known by those in the semiconductor art that the amount of radiant energy entering the device may not be as critical as if the devices 10 and 110 were used as a solar cell. Therefore, modifications obvious to those in the art can be made to the devices 10 and 110 if it is to function as a photodetector, e.g. removal of antireflection layer and the replacement of the grid electrode with a contact pad.

The utilization of glow discharge amorphous silicon in the photovoltaic and photodetector devices of the present invention provides devices with a thinner body than devices of the same basic structure but of single crystalline silicon. Also devices utilizing glow discharge amorphous silicon are capable of solar radiation absorption comparable to that of single crystal silicon photovoltaic and photodetector devices having bodies of a factor of 10 times thicker. Thus, the specific advantage of the present invention as a photovoltaic or photodetector device is the cost reduction realized by the utilization of a thinner active region. Moreover, the present invention as a photovoltaic device also provides a cost reduction in generation of electrical power from solar radiation because there is less energy expended in making devices of the present invention since fabrication is at temperatures lower than single crystal device fabrication; and larger area solar cells can be fabricated as compared to single crystalline solar cell fabrications.

It has also been discovered that the semiconductor devices 10 and 110 are capable of current rectification in the dark. As an example the Schottky barrier semiconductor device 10, with a substrate 12 of #304 stainless steel, a uniform phosphorous doped first layer 14, a metallic film 18 of palladium, 1,000Å to 2,000Å in thickness so as to function as an electrical contact, and without the grid electrode 22 and antireflection layer 24, demonstrates a current rectification ratio of 10$^4$ at $\pm$ 0.4 volts. While the devices 10 and 110 were described as solar cells but can function as current rectifiers, it would be obvious to those skilled in the semiconductor art that their utility as rectifiers would be more desirable with some minor modifications, such as the removal of the antireflection layers.

In the semiconductor device of the present invention, the first layer is of doped amorphous silicon and the second layer is of amorphous silicon, and the device can function as either a solar cell, photodetector or current rectifier.

We claim:

1. A Schottky barrier semiconductor device comprising:
    an annealed body of amorphous silicon fabricated by a glow discharge in silane, SiH$_4$;
    a metallic film on a surface of said body providing a surface barrier junction at the interface of said metallic film and said body; and means for making an ohmic contact to said body.

2. A Schottky barrier semiconductor device comprising:
- a body of amorphous silicon fabricated by a glow discharge in silane, $SiH_4$; said body having a first layer of doped amorphous silicon fabricated by a glow discharge in a mixture of silane and a doping gas, and a second layer of amorphous silicon fabricated by a glow discharge in silane on a surface of said first layer;
- a metallic layer on a surface of said second layer opposite said first layer providing a surface barrier junction at the interface of said metallic film and second layer, said surface barrier junction being capable of generating an electric field in said second layer; and
- means for electrically contacting said first layer.

3. The Schottky barrier semiconductor device in accordance with claim 2 wherein second layer is of amorphous silicon fabricated by a glow discharge in substantially pure silane.

4. The Schottky barrier semiconductor device in accordance with claim 3 wherein said first layer is of N type conductivity.

5. The Schottky barrier semiconductor device in accordance with claim 2 wherein said means for electrically contacting said first layer is a substrate on said first layer, said substrate is electrically conductive and capable of having an ohmic contact with said first layer.

6. The Schottky barrier semiconductor device in accordance with claim 5 wherein the dopant concentration of said first layer is graded such that it is a maximum at the interface of said first layer and said substrate and decreases in the direction of the interface of said first and second layers.

7. The Schottky barrier semiconductor device in accordance with claim 6 wherein the dopant concentration at the interface of said first and second layers is insignificant.

8. The Schottky barrier semiconductor device in accordance with claim 7 wherein the maximum dopant concentration is on the order of 5 atomic percent.

9. The Schottky barrier semiconductor device in accordance with claim 8 wherein said doping gas is selected from the group consisting of phosphine, arsine, antimony, bismuth, sodium hydride and cesium nitride.

10. The Schottky barrier semiconductor device in accordance with claim 5 wherein the dopant concentration of said first layer is substantially uniform through said first layer.

11. The Schottky barrier semiconductor device in accordance with claim 2 wherein said body of amorphous silicon is annealed.

12. The Schottky barrier semiconductor device in accordance with claim 2 wherein said doping gas is selected from the group consisting of phosphine, arsine, antimony, bismuth, sodium hydride and cesium nitride.

13. The Schottky barrier semiconductor device in accordance with claim 2 wherein said means for electrically contacting said first layer is an intermediate layer on said first layer, said intermediate layer being capable of having an ohmic contact with said first layer.

14. The Schottky barrier semiconductor device in accordance with claim 13 wherein said intermediate layer is on an electrically conductive substrate capable of having an ohmic contact with said intermediate layer.

15. The Schottky barrier semiconductor device in accordance with claim 14 wherein said intermediate layer is of doped amorphous germanium fabricated by a glow discharge in germane, $GeH_4$, and a doping gas.

16. The Schottky barrier semiconductor device in accordance with claim 15 wherein said intermediate layer is of N type conductivity.

17. The Schottky barrier semiconductor device in accordance with claim 15 wherein said doping gas is selected from the group consisting of phosphine, arsine, antimony, bismuth, sodium hydride and cesium nitride.

18. The Schottky barrier semiconductor device in accordance with claim 14 wherein said intermediate layer is of a doped germanium-silicon alloy fabricated by a glow discharge in a mixture of germane, $GeH_4$, silane, $SiH_4$, and a doping gas.

19. The Schottky barrier semiconductor device in accordance with claim 18 wherein said intermediate layer is of N type conductivity.

20. The Schottky barrier semiconductor device in accordance with claim 18 wherein said doping gas is selected from the group consisting of phosphine, arsine, antimony, bismuth, sodium hydride and cesium nitride.

21. The Schottky barrier semiconductor device in accordance with claim 14 wherein said substrate is of aluminum.

22. In a method of fabricating a Schottky barrier semiconductor device wherein a metallic film, which forms a Schottky barrier on a semiconductor body, is deposited onto said semiconductor body and an ohmic contact is formed on said body opposite to said Schottky barrier, the improvement which comprises the steps of:
- forming a body of amorphous silicon by glow discharge in silane; and
- annealing said body prior to the deposition of said metallic film which forms a Schottky barrier to said semiconductor body.

23. In the method of fabricating a Schottky barrier device in accordance with claim 22 wherein said annealing is performed in a vacuum.

24. In the method of fabricating a Schottky barrier device in accordance with claim 22 wherein said annealing is performed in a forming gas atmosphere.

25. The method of fabricating a Schottky barrier semiconductor device in accordance with claim 22 wherein said body is annealed at a temperature in the range of 200° C. to 450° C. for a few minutes to several hours.

26. In a method of fabricating a Schottky barrier semiconductor device, the steps of:
- forming a first layer of doped amorphous silicon by a glow discharge in a mixture of silane and a doping gas;
- forming a second layer of amorphous silicon by a glow discharge in silane on said first layer; and
- annealing said first and second layers at a temperature in the range of 200° C. to 450° C. for a few minutes to several hours.

27. In the method of fabricating a Schottky barrier device in accordance with claim 26 wherein said annealing is performed in a vacuum.

28. In the method of fabricating a Schottky barrier device in accordance with claim 26 wherein said annealing is performed in a forming gas atmosphere.

29. In a method of fabricating a Schottky barrier semiconductor device having a body of amorphous silicon prepared by a glow discharge in silane and a metallic film on said body, the step of:

heating said device to a temperature in the range of 150° C. to 250° C. for about 5 to 30 minutes.

30. In the method of fabricating a Schottky barrier device in accordance with claim 29 wherein said heating is in a vacuum.

31. In the method of fabricating a Schottky barrier device in accordance with claim 29 wherein said heating is in a forming gas atmosphere.

32. In the method of fabricating a Schottky barrier device in accordance with claim 31 wherein said forming gas is 90% nitrogen and 10% hydrogen by volume.

33. In a method of fabricating a Schottky barrier semiconductor device having a first layer of doped amorphous silicon prepared by a glow discharge in a mixture of silane and doping gas, a second layer of amorphous silicon prepared by a glow discharge in silane on said first layer and a metallic film on said second layer, the step of:

heating said device to a temperature in the range of 150° C. to 250° C. for bout 5 to 30 minutes.

34. In the method of fabricating a Schottky barrier device in accordance with claim 33 wherein said heating is performed in a vacuum.

35. In the method of fabricating a Schottky barrier device in accordance with claim 33 wherein said heating is performed in a forming gas atmosphere.

36. A method of fabricating a Schottky barrier semiconductor device, the steps of:

forming a body of amorphous silicon by a glow discharge in silane;

depositing a metallic layer on a surface of said body;

heating said body and metallic film to a temperature in the range of 150° C. to 250° C. for about 5 to 30 minutes;

depositing an electrode on a portion of a surface of said metallic film opposite said body;

depositing an antireflection layer on the portion of the surface of said metallic film and on said electrode; and heating said device to a temperature in the range of 150° C. to 250° C. for about 5 to 30 minutes.

37. In a method of fabricating a Schottky barrier semiconductor device, the steps of;

forming an intermediate layer;

forming a first layer of doped amorphous silicon by a glow discharge in a mixture of silane and a doping gas on said intermediate layer;

forming a second layer of amorphous silicon by a glow discharge in silane on said first layer; and annealing said first and second layers at a temperature in the range of 200° C. to 450° C. for a few minutes to several hours.

* * * * *